(12) United States Patent
Liang

(10) Patent No.: US 10,027,089 B2
(45) Date of Patent: Jul. 17, 2018

(54) COUPLED RING RESONATOR SYSTEM

(71) Applicant: Hewlett-Packard Development Company, L.P., Houston, TX (US)

(72) Inventor: Di Liang, Santa Barbara, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 17 days.

(21) Appl. No.: 14/772,352

(22) PCT Filed: Mar. 13, 2013

(86) PCT No.: PCT/US2013/030868
§ 371 (c)(1),
(2) Date: Sep. 2, 2015

(87) PCT Pub. No.: WO2014/142832
PCT Pub. Date: Sep. 18, 2014

(65) Prior Publication Data
US 2015/0380900 A1 Dec. 31, 2015

(51) Int. Cl.
*G02B 6/293* (2006.01)
*H01S 5/10* (2006.01)
*H01S 5/14* (2006.01)
*H04B 10/80* (2013.01)
*G02F 1/025* (2006.01)
(Continued)

(52) U.S. Cl.
CPC ........ *H01S 5/1071* (2013.01); *G02B 6/29341* (2013.01); *G02F 1/025* (2013.01); *H01S 5/0265* (2013.01); *H01S 5/06804* (2013.01); *H01S 5/1032* (2013.01); *H01S 5/142* (2013.01); *H01S 5/3013* (2013.01); *H04B 10/801* (2013.01);
(Continued)

(58) Field of Classification Search
CPC .... H01S 5/1071; H01S 5/142; G02B 6/29341
See application file for complete search history.

(56) References Cited

U.S. PATENT DOCUMENTS 5,363,192 A 11/1994 Diels et al.
5,867,520 A * 2/1999 Liedenbaum ......... H04L 7/0075
327/119
(Continued)

FOREIGN PATENT DOCUMENTS

CN 101257189 9/2008
CN 1938917 12/2010
(Continued)

OTHER PUBLICATIONS

Machine Translation of JP 10261837 A reference, Uchida, Sep. 29, 1998.*
(Continued)

*Primary Examiner* — Jerry Rahll
(74) *Attorney, Agent, or Firm* — Dhand Law

(57) ABSTRACT

An example system includes a first ring resonator element for imparting optical gain to a light signal. The example system further includes a second ring resonator element optically coupled to the first ring resonator element for modulating the light signal. A waveguide can be optically coupled to one of the first ring resonator element or the second ring resonator element for receiving the light signal output from the one of the first ring resonator element or the second ring resonator element, and transmitting the received light signal.

21 Claims, 5 Drawing Sheets

(51) Int. Cl.
- *H01S 5/068* (2006.01)
- *H01S 5/30* (2006.01)
- *H01S 5/026* (2006.01)
- *H01S 5/02* (2006.01)
- *H01S 5/06* (2006.01)

(52) U.S. Cl.
CPC ............. *H01S 5/021* (2013.01); *H01S 5/0215* (2013.01); *H01S 5/0612* (2013.01)

(56) References Cited

U.S. PATENT DOCUMENTS

| | | | |
|---|---|---|---|
| 6,554,193 B1 | 4/2003 | Fehrman et al. | |
| 6,685,097 B1 | 2/2004 | Housse | |
| 6,792,025 B1* | 9/2004 | Behfar | H01S 5/1071 372/93 |
| 7,058,096 B2 | 6/2006 | Sarlet et al. | |
| 7,072,531 B2 | 7/2006 | Djordjev et al. | |
| 7,697,578 B2 | 4/2010 | Yamazaki | |
| 2005/0063426 A1* | 3/2005 | Sparacin | H01S 3/0632 372/6 |
| 2005/0213632 A1 | 9/2005 | Nebendahl | |
| 2006/0056760 A1* | 3/2006 | Djordjev | G02B 6/12007 385/15 |
| 2007/0230856 A1* | 10/2007 | Yamazaki | G02F 1/0147 385/5 |
| 2008/0232409 A1* | 9/2008 | Yamazaki | G02B 6/12004 372/20 |
| 2010/0034223 A1 | 2/2010 | Osinski et al. | |
| 2010/0183259 A1 | 7/2010 | Tobing et al. | |
| 2011/0063710 A1* | 3/2011 | Chao | G02B 6/12007 359/276 |
| 2011/0235667 A1 | 9/2011 | Fukuda | |
| 2012/0170600 A1 | 7/2012 | Lin et al. | |
| 2013/0037692 A1* | 2/2013 | Akiyama | G02F 1/0115 250/201.1 |
| 2013/0088720 A1* | 4/2013 | Sorrentino | G01C 19/64 356/460 |

FOREIGN PATENT DOCUMENTS

| | | |
|---|---|---|
| CN | 202127399 | 1/2012 |
| JP | 10261837 A * | 9/1998 |
| JP | 10261837 A | 9/1998 |
| WO | WO-2011113150 A1 | 9/2011 |
| WO | 2013091353 A1 | 6/2013 |

OTHER PUBLICATIONS

Official Action issued in related Singapore Patent Appln. No. 10201504072Q, dated Oct. 12, 2015 (8 pages).

International Search Report & Written Opinion received in PCT Application No. PCT/US2013/030868, dated Dec. 11, 2013, 11 pages.

Tu, X. et al., "Ultraviolet Single-frequency Coupled OptoFluidic Ring Resonator Dye Laser," (Research Paper), Aug. 16, 2012, vol. 20, No. 18, 6 pages, available at http://www.opticsinfobase.org/view_article.cfm?gotourl=
http%3A%2F%2Fwww%2Eopticsinfobase%2Eorg%2FDirect-PDFAccess%2F509CDFDE-9537-14AC-09DE11B48A754031_240726%2Foe-20-18-19996%2Epdf%3Fda%3D1%26id%3O240726%26seq%3D0-%26mobile%3Dnp&org.

Dominik G. Rabus; "Optical Fileters Based on Ring Resonators with Integrated Semiconductor Optical Amplifiers in GaInAsP—InP"; IEEE Journal of Selected Topics in Quantum Electronics, vol. 8, No. 6; Nov./Dec. 2002.

Extended European Search Report dated Nov. 4, 2016 for EP Application No. 138780062.2; p. 10.

Hamacher M et al: "Optically amplifying microring resonator components based on GaInAsP/InP: challenges and perpectives", Semiconductor Conference, 2004. CAS 2004 Proceedings 2004 International Sinaia Romania Oct. 4-6, 2004.

* cited by examiner

COUPLED RING RESONATOR SYSTEM

BACKGROUND

Light beams or optical signals can be used to transmit digital data between electronic devices, both over long distances (long haul communications) and short distances, e.g., between data centers (short haul communications), as well as between adjacent circuit boards or even between components on a single circuit board. Consequently, optical technology plays a significant role in modern electronics, and many electronic devices may employ optical components. Examples of such optical components include, but are not limited to, optical or light sources such as light emitting diodes and lasers, waveguides, fiber optics, lenses and other optics, photo-detectors and other optical sensors, optically-sensitive semiconductors, and others.

BRIEF DESCRIPTION OF THE DRAWINGS

For a more complete understanding of examples of the present disclosure, reference is now made to the following descriptions taken in connection with the accompanying drawings in which.

DETAILED DESCRIPTION

Figure 1:
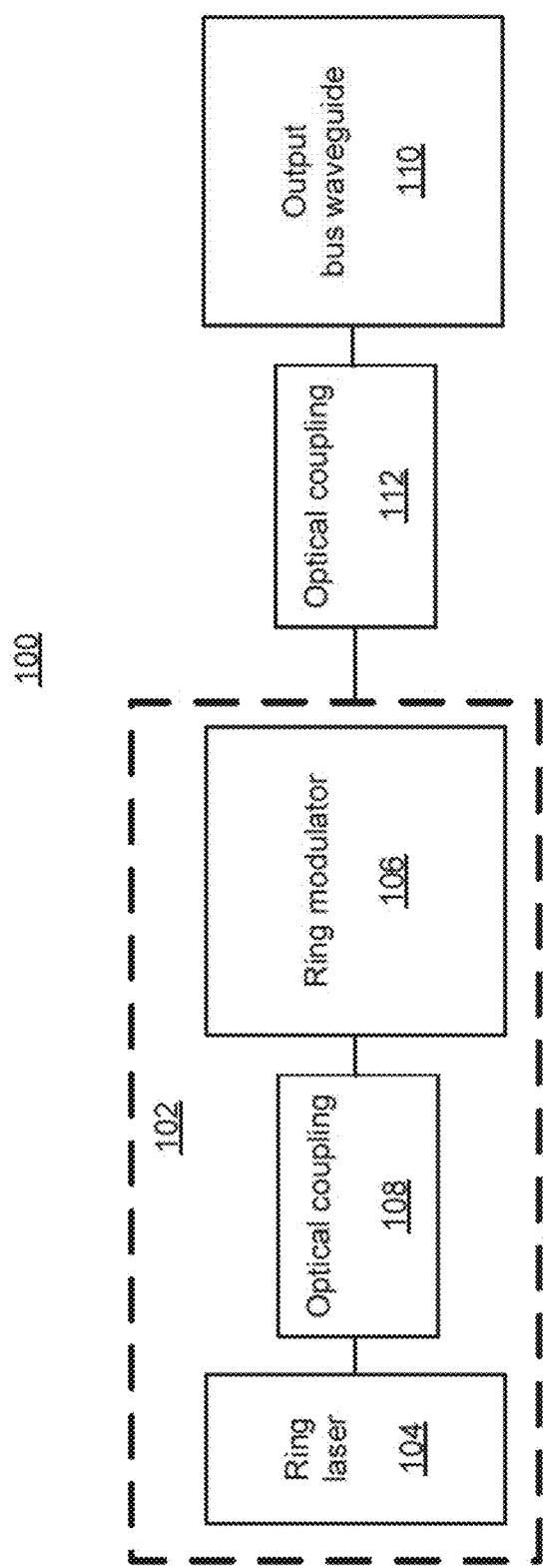
FIG. 1 is an architecture of a coupled ring resonator system in accordance with one example.

As noted above, light or optical beams can be used for a variety of purposes, including the transmission of data. In many cases, interconnections between electrical components are made using metal wires that conduct electrical signals. As electronic components have become more integrated, the wires have become more numerous, narrower, and more closely spaced. This results in a higher resistance in the wires and higher capacitance and inductance between adjacent wires. This increased resistance and capacitance may degrade electrical signals traveling through the wires, reducing the performance of the integrated circuit chips and a computing device as a whole. Further, the bandwidth capability of a wire is directly proportional to the cross-sectional area of the wire. Therefore, as the wire becomes increasingly narrow, the rate at which information can be transmitted through the wire decreases.

One solution to these issues is using optical signals to communicate data between electrical components. In an optical interconnect system, the electrical signal from an integrated circuit (IC) chip or circuit component is converted into an optical signal emitted by a light source, the optical signal being modulate to represent data. The light then travels through free space or through a waveguide to a detector which converts the received optical signal back into an electrical data signal. For example, photonic IC (PIC) devices can integrate multiple photonic functions for transmitting information signals imposed on optical wavelengths, where photonics can refer to the science of generating, emitting, transmitting, modulating, signal processing, switching, amplifying, and detecting/sensing light.

Optical interconnections can consume less power than traditional electrical interconnections as the distance traversed increases. Further, optical interconnections are not constrained by capacitance or electrical resistance, dissipate less power than their electrical counterparts, and have the capability to transmit a greater volume of data. Optical interconnection between a modulator and a detector may be accomplished via free space transmission or through a waveguide. Optical fibers are one example of a waveguide.

Conventional optical interconnection systems generally produce light with an off-chip light source such as a vertical cavity surface-emitting laser (VCSEL). In such systems, the off-chip light source is normally directly modulated by the circuit on the chip to superimpose information on the optical beam emitted by the light source. A cavity or resonator may be utilized such that light can circulate, e.g., between two mirrors, and within this cavity, a gain medium, such as a laser crystal, can amplify the light. Linear or standing wave cavity/resonator lasers are made such that the light can bounce between two end mirrors, and counterpropagating waves exist which can interfere with each other to form a standing wave pattern.

In accordance with various examples disclosed herein, a coupled ring resonator system is provided to effectuate a single-wavelength ring laser by vernier effect. In such a coupled ring resonator system, one ring (e.g., a ring laser) may be utilized to provide optical gain, while another ring (e.g., a ring modulator) may be utilized to provide modulation. The coupling of the ring laser and the ring modulator can result in low power consumption modulation and wavelength tuning. Additionally, resonance wavelength mismatch (experienced between lasers and modulators in conventional external modulation systems) can be avoided.

FIG. 1 illustrates an architecture of a coupled ring resonator system 100 in accordance with various examples. The coupled ring resonator system 100 may include a coupled ring resonator portion 102 that can include a ring laser 104 and a ring modulator 106. The ring laser 104 and the ring modulator 106 may be "connected" by virtue of optical coupling 108, which as will be described in greater detail below, may be a result of locating the ring laser 104 and the ring modulator 106 close enough to allow for evanescent coupling of an optical signal, resulting in a single resonator cavity. The coupled ring resonator portion 102 can in turn, be optically coupled via optical coupling 112 to an output bus waveguide for transporting the optical signal input from the coupled ring resonator portion 102, where again, the optical coupling 112 may be effectuated by evanescent coupling of the optical signal from the coupled ring resonator portion 102 to the output bus waveguide 110.

As used herein, the term "optical energy" may refer to radiated energy having a wavelength, e.g., generally between 10 nanometers and 500 microns. Optical energy as thus defined can include, but is not limited to, ultraviolet, visible, and infrared light. The term "optical source" can refer to a device from which optical energy originates. Examples of optical sources as thus defined include, hut are not limited to, light emitting diodes, lasers, light bulbs, and lamps. In the various examples discussed below, the optical source may be a ring laser.

As used herein, the terms "optical cavity" or "optical resonator" may refer to a structure that sustains optical energy having a certain resonant wavelength or range of wavelengths, and that suppresses or attenuates other optical energy by destructive interference.

As used herein, the term "optically active" can refer to a material that responds to incidence of a photon or optical energy by creating a charge that can be collected by an electrode.

As used herein, the term "quantum well" may refer to a structure consisting of a thin layer of narrower band gap semiconductor sandwiched between thicker layers of a wider band gap material. By way of example and not limitation, a quantum well may be comprised of a thin germanium layer sandwiched between two layers of silicon or a thin layer of gallium arsenide (GaAs) sandwiched between aluminum gallium arsenide (AlGaAs). The term "band gap" can refer to the difference between a conduction band energy level and the valence band energy level for a given material. Thus, a wide variety of material combinations can be used to construct a quantum well. It should be further noted that the active optical layer may be made up of multiple quantum well (MQW) layers or of a combination of quantum well layers that utilize different materials.

As used herein, the term "dielectric" may broadly refer to a material that provides electrical insulation. For example, silicon dioxide ($SiO_2$) can be used as a dielectric, although a dielectric layer may be composed of different materials.

As used herein, the term "p-type semiconductor" may refer to any semiconductor layer to which impurity acceptor materials have been added such that electron holes are majority carriers, while electrons are minority carriers. Similarly, the term "n-type semiconductor" can refer to any layer to which impurity election donor materials have been added such that electrons are the majority carriers, while electron holes are minority carriers.

Figure 2A:
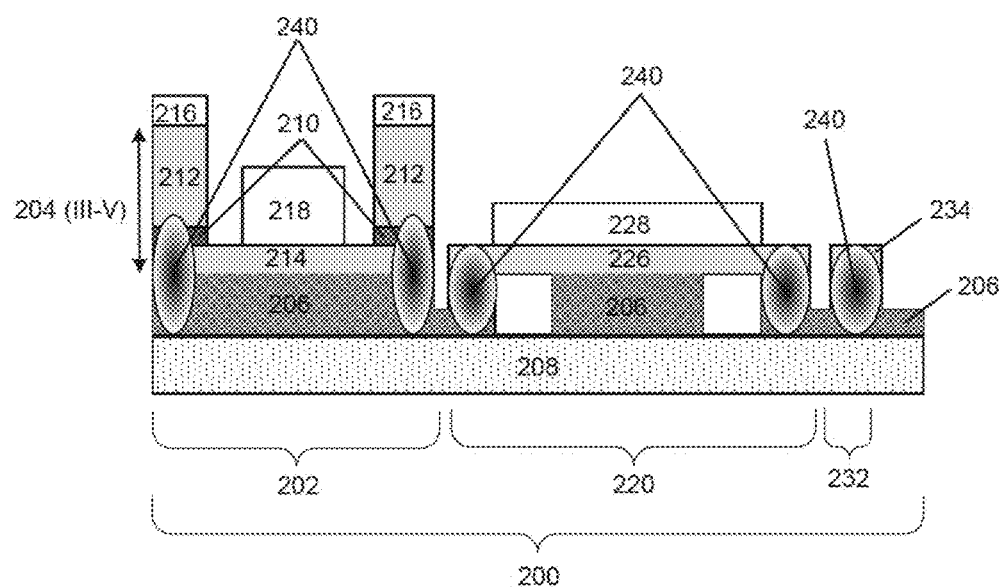
FIG. 2A is a cross-sectional view of a coupled ring resonator system in accordance with one example.
Figure 2B:
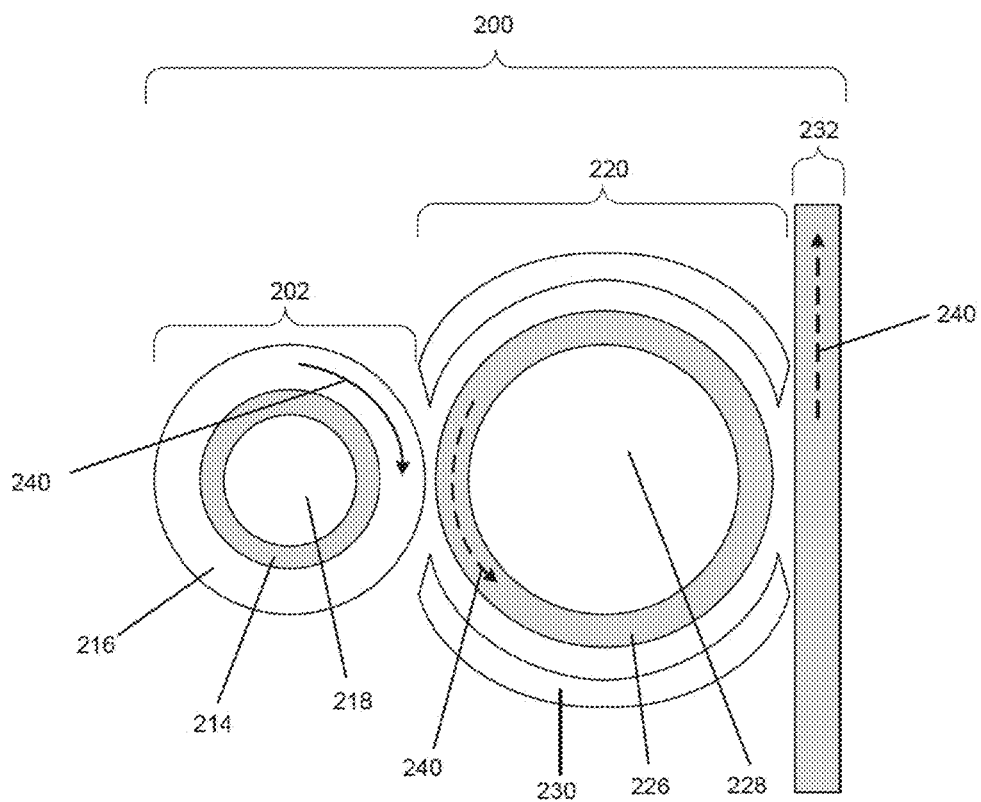
FIG. 2B is a top view of tire coupled ring resonator system of FIG. 2A.

Referring now to FIGS. 2A and 2B, a coupled ring resonator system 200, in accordance with one example, is illustrated as having a ring laser 202 coupled to a ring modulator 220, which in turn, is coupled to a bus waveguide 232. The coupled ring resonator system 200 may be an example of the coupled ring resonator system 100 of FIG. 1, and the ring laser 202, ring modulator 220, and bus waveguide 232 may be examples of the ring laser 102, the ring modulator 106, and the output bus waveguide 110 of FIG. 1, respectively.

The ring laser 202 may be e.g., a hybrid silicon microring laser. Optoelectronic integration on silicon can refer to a technology used to build optical interconnection systems and other large-scale photonic systems on a chip. Integrated photonic systems typically use a lower cost and easy-to-integrate electrically pumped laser source. Silicon, however, is limited by its fundamental material properties and therefore cannot efficiently provide the optical gain used in laser operation. Therefore, hybrid integration of gain material, such as III-V group semiconductors located on a silicon platform, can be used to construct the ring laser 202.

The ring laser 202 may have a resonator that is in the form of a ring. In contrast to the aforementioned linear or standing wave cavity/resonator lasers, a travelling-wave resonator, e.g., a resonator having a substantially ring or a disk-like form, can allow for, e.g., two different propagation directions. The ring resonator itself can be made up of a set of waveguides in which at least one is a closed loop that is coupled to some light source/input and output, e.g., a waveguide. When light of a resonant wavelength is passed through the ring resonator, intensify of the light builds up as the light makes round trips around the ring resonator. This increase in intensity (gain) is a result of constructive interference.

In this example, a III-V microring resonator 204 may be placed on top of a silicon substrate 206, which in turn, may rest on a silicon-on-insulator (SOI) substrate 208. The silicon substrate 206 can support the microring resonator 204. SOI substrates may be made, e.g., by wafer bonding an oxidized silicon wafer onto another silicon carrier wafer. Such wafer bonding of compound semiconductors to SOI substrates can take advantage of the gain characteristics of compound semiconductors as well as the passive waveguide characteristics of silicon waveguides.

The III-V microring resonator 204 may include an MQW layer 210 sandwiched by an indium phosphide (InP) cladding layer 212 and an InP contact layer 214. The InP cladding layer 212 can be p-doped to create a p-type semiconductor layer 216, and the InP contact layer 214 can be n-doped resulting in an n-type semiconductor layer 218. The InP cladding layer 212 and the InP contact layer 214 may be utilized to substantially constrain/confine light within the microring resonator 204. The MQW layer 210 may be considered to be the optically active layer, and may include a plurality of, e.g., InAlGaAs-based quantum wells. As described above, light 240 can travel within the optical cavities of the ring laser 202.

It should be noted that the disclosure described herein need not be limited to the specific geometry, dimensions, or materials of a particular example. As indicated above, a quantum well could be formed of materials other than a thin layer of germanium sandwiched between silicon. Additionally, the various layers described above can be formed with alternate doping and geometries. Further still, other types of substrates that may be utilized in semiconductor manufacturing processes are considered to be within the scope of the disclosure. Moreover, and as will be discussed below, various other configurations for a coupled ring resonator system are possible while remaining within the scope of the present disclosure.

The ring modulator 220 can be, e.g., a hybrid silicon metal-oxide-semiconductor (MOS) ring modulator. Similar to the ring laser 202, an n-doped InP contact layer 226 can result in an n-type semiconductor layer 228, which may rest on silicon substrate 206. FIG. 2B further illustrates a p-type contact 230 (not shows in FIG. 2A) on Si (i.e., the SOI substrate 208), the area between the n-doped InP contact layer 226 and the p-type contact 230 being, e.g., etched Si. The ring modulator also rests on the SOI substrate 208. The optical coupling of the ring modulator 220 to the ring laser 220, as will be discussed in greater detail below, allows the light 240 from the ring laser 202 to pass through to the ring modulator 220 and circulate within the optical cavities of the ring modulator 220, where, effectively, a single laser resonator cavity can be created. It should be noted that the ring modulator 220 may be implemented in various ways, and not necessarily a MOS-type modulator. For example, a carrier injection/depletion, electroabsorption or thermal ring modulator may be utilized in accordance with other contemplated examples.

Modulation of light energy, e.g., light 240, conveyed through the ring laser 202 is accomplished by the aforementioned optical coupling effect. The term "modulation" as utilized herein can refer to encoding information in light transmitted through a modulator by converting electrical signals into optical variations in the transmitted light.

To modulate the light 240 circulating within the ring modulator 220, an electrical signal that represents the information to be encoded into the light is generated and conveyed to ring modulator 220 as a voltage difference. A p-n junction can be formed if carriers can transport through an InP/Si interface. Depending on the bias on the p- and n-type contacts/layers, electrical carriers can be injected or depleted from the Si and InP. If there is a layer of dielectric between the Si and InP, which blocks carrier transport from one layer to another, a capacitor structure may be realized. Then, carriers can be accumulated or depleted around the dielectric in Si and InP. Both operation schemes can lead to the electrical carrier concentration variation in Si and InP, and their refractive indices and optical losses are changed accordingly with this carrier concentration variation. Thus, resonance wavelength and optical signal amplitude can be modulated by controlling the voltage applied to the p-and n-type contacts/layers, via e.g., electrodes connected to the p and n-type contacts/layers.

The bus waveguide 230 may be any optical waveguide made up of a spatially inhomogeneous structure for guiding light, e.g., light 240, and can include InP cladding 234 atop the silicon substrate 206. Again, the bus waveguide 232 may rest on the SOI substrate 208. It should be noted that any optically transparent material(s) may be utilized to implement the bus waveguide 232 to suit a particular application or desired operation. Again, locating the ring modulator 220 sufficiently close to the bus waveguide 232 may enable evanescent coupling of the optical signal, i.e., light 240.

Regarding the optical coupling aspect of the various examples described herein, the optical coupling of the ring laser 202 to the ring modulator 220 and the ring modulator 220 to the bus waveguide 232 occurs if these elements are close enough to allow for the light 240 to be transmitted from one element to the next. The distance, coupling length, and refractive indices of these elements can affect the optical coupling. Accordingly, the light 240 output from the ring laser 202 travels in the same direction as input into the ring modulator 220, which in turn is output from the ring modulator and input into the bus waveguide 232. This direction of propagation is illustrated in FIG. 2B.

In particular, and as the light 240 travels around the ring laser 202, the subsequent loops around the ring laser 202 can bring the light 240 to the resonance condition of the ring modulator 220, and the ring laser 202 and the ring modulator 220 can be coupled together and the light 240 will be passed into the ring modulator 220. By the same token, the light 240 can eventually be transferred into the bus waveguide 232. Therefore, in order to transmit light through the coupled ring resonator system 200, the resonant condition for the ring laser 202 and the ring modulator 220 should be satisfied. That is, the wavelength of the light 240 in the ring laser 202 (e.g., $\lambda_1$) and in the ring modulator 220 (e.g., $\lambda_2$) should be the same (i.e., $\lambda_1=\lambda_2$) for resonance to occur, which they are due to the optical coupling provided in accordance with various examples. Additionally, and due to the aforementioned coupling of the ring laser 202 and the ring modulator 220, as previously described, a single laser resonator cavity can be created, where optical gain is only provided in one of the rings (i.e., either the ring laser 202 or the ring modulator 220).

It should be noted that various dimensions of the ring laser 202 and ring modulator are contemplated in accordance with various examples. Moreover, different configurations are also contemplated in accordance with various examples. That is, and in the example illustrated in FIGS. 2A and 2B, the ring modulator 220 is optically coupled to the bus waveguide 232. However, and in another example, a ring modulator may be optically coupled to a ring laser, where the ring laser can be coupled to a bus waveguide. Moreover, more than a single ring laser and/or more than a single ring modulator can be utilized in accordance with other examples contemplated herein.

The ring laser 202 may lase in multiple wavelengths when its free spectral range (FSR) (which is inversely proportional to the cavity length of the ring laser 202) is smaller than the gain bandwidth. The term "FSR" can refer to the frequency spacing of the axial resonator modes of a resonator. Thus, resulting lasing peaks other than the primary (e.g., desired) lasing peak/wavelength can lead to crosstalk, as well as equivalent electrical power waste in the system. Accordingly, a "single-wavelength" ring laser 202 may often be desirable, where when the FSR is greater, the secondary, multiple wavelengths can be eliminated, and the primary/desired wavelength is the only wavelength being lased by the ring laser 202.

As described above, different dimensions and/or geometries are contemplated in accordance with various examples. However, and although a small single-wavelength ring laser may be preferable (e.g., to achieve greater FSR), certain issues can arise the smaller the cavity length of a ring laser gets. These issues can include, but are not necessarily limited to, higher optical cavity loss (where the light may not be sufficiently contained/constrained within the optical cavity), and higher system/device thermal impedance, where the temperature of the device/system can heat too quickly and degrade performance.

Accordingly, the size/diameter of the cavities of the ring laser 202 and the ring modulator 220 may be chosen in accordance with various examples to provide a sufficiently large coupled FSR ($FSR_{coupled}$) such that a single wavelength is lased, without necessarily being forced to rely on as small a ring laser as possible. Therefore, the issues of higher cavity loss and higher thermal impedance can be avoided.

That is, FSR may be expressed as follows:

$$FSR = \frac{\lambda_0^2}{n_g \times \pi D}$$

FSR may be calculated for each of the ring laser 202 and the ring modulator 220, where $\lambda_0$ can refer to the ideal, vacuum wavelength (e.g., desired resonant wavelength), $n_g$ (which may be the same or different for the ring laser 202 and the ring modulator 220) can refer to the group effective refractive index (which is the ratio of the vacuum velocity of light to the group velocity in a medium), and D can refer to the respective diameters/cavity lengths of the ring laser 202 and the ring modulator 220. It should be noted that the effective refractive index (also referred to as modal index) may depend on wavelength as well as the mode (in multi-mode waveguides) in which light propagates.

By way of the vernier effect, where small relative refractive index changes can be used to yield larger relative wavelength changes, $FSR_{coupled}$ can be expressed as follows:

$$FSR_{coupled}=mFSR_{r1}=nFSR_{r2}$$

That is, a small mismatch in $FSR_r$ can lead to a very large $FSR_{coupled}$, where $FSR_{r1}$ and $FSR_{r2}$ can refer to the FSR associated with one of the ring laser 202 and the ring modulator 220, and where m and n are coprime integers. Thus, the relative sizes of the ring laser 202 and the ring modulator 220 can be altered as desired to achieve the requisite/sufficient FSR for single wavelength lasing, while avoiding or at the least, mitigating increased cavity loss and increasing thermal impedance as a result of reducing the dimensions of single ring cavity.

Figure 3A:
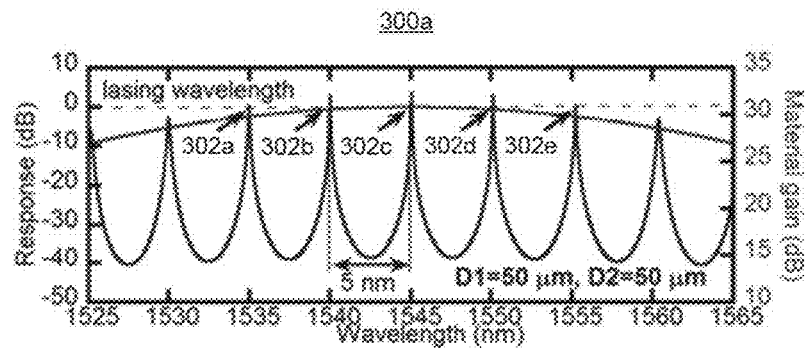
FIGS. 3A-3C illustrate example effects to Free Spectral Range (FSR) by altering ring diameter of the coupled ring resonator system of FIG. 2A.
Figure 3B:
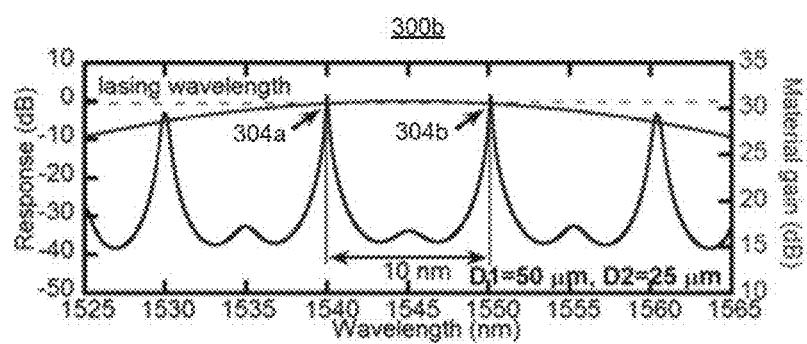
Figure 3C:
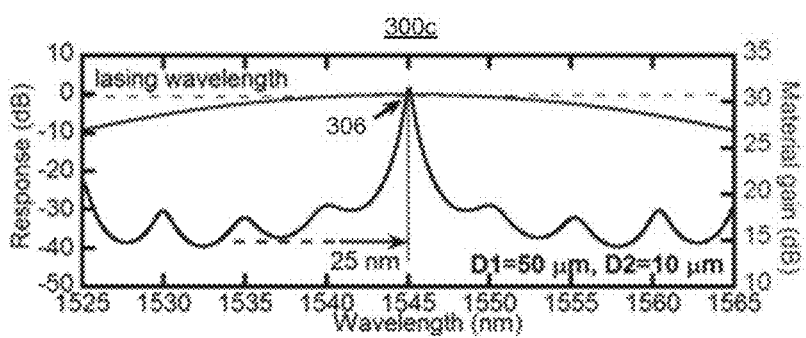

FIGS. 3A-3C illustrate example effects of altering the diameter of either the ring laser 202 or the ring modulator 220 relative to the other. In these examples, it may be assumed that a Gaussian-shape material gain with 3 dB bandwidth approximating 30 nm is utilized. FIG. 3A illustrates an example graph 300a which shows that if the ring laser 202 and the ring modulator 220 are configured to have the same diameter (D1=50 μm and D2=50 μm, respectively, and also assuming identical modal and group index for the two rings), the resulting $FSR_{coupled}$ is 5 nm. Accordingly, the coupled ring resonator system 200 would be lasing multiple wavelengths (302a, 302b, 302c, 302d, 302e, etc.) As described above, this would be an undesirable result when single-wavelength lasing is desired. FIG. 3B illustrates an example graph 300b which shows that if the one of the ring laser 202 or the ring modulator 220 (in this instance, the ring modulator 220) is downsized to have one-half the diameter of the other (in this instance, the ring laser 202) such that D1=50 μm and D2=25 μm, an $FSR_{coupled}$ of 10 nm can result. This would be an improvement over the example illustrated in FIG. 3A, but multiple wavelengths, i.e., 304a and 304b, would still be lased. However, and as illustrated in FIG. 3C and the example graph 300c, when diameter of one of the ring laser 202 and the ring modulator 220 is configured/downsized to, e.g., ⅕ that of the other (again in this example, the ring modulator 220), the $FSR_{coupled}$ is 25 nm, resulting in the coupled ring resonator system 200 lasing at a single wavelength 306.

It should be noted that these examples are not intended to be limiting. Rather, and as previously alluded to, depending on the desired wavelengths, material properties, geometries, dimensions, etc., the respective diameters of the ring laser 202 and ring modulator 220 may be adjusted to meet desired operating characteristics. That is, the ratio between ring laser and ring modulators need not necessarily always be 1:5 to achieve single wavelength lasing. As also alluded to above, the present disclosure contemplates the use of more than a single ring laser and/or more than a single ring modulator, which again, may affect the configured diameters of the one or more ring lasers and the one or more ring modulators. Therefore, the coupled ring resonator system 200 can be easily adapted to a variety of conditions.

Yet another issue that can arise from the use of an integrated (but not coupled, such as coupled ring resonator system 200) ring resonator system to carry one or more signal channel(s), as can be the case, for example, in the aforementioned external modulation format of conventional systems, is resonance mismatch. Resonance mismatch can refer to the resonant wavelength of a laser not equaling the resonant wavelength of a modulator, which may be inevitable due to unavoidable imperfections in the manufacturing/fabrication of ring laser(s) and/or ring modulators). That is, and as described above, the optical coupling of the ring laser 202 and the ring modulator 220 in accordance with various examples, allows for the resonant wavelengths of the ring laser 202 and the ring modulator 220 to be the same. However, and again, without the coupling described herein, wavelength tuning may be required, where such wavelength tuning is often a power-hungry process that may require more complicated circuitry/system.

For example, preferred optical interconnect systems are those that consume as little power as possible to operate. Tuning wavelength, however, may entail the use of a heater on top of the system which can affect temperature, which in turn, can affect the properties of the materials utilized in constructing the various elements of the system, such as the ring laser, bus waveguide, etc. Moreover, and due to a phenomenon that can be referred to as the plasma dispersion effect, whereby higher carrier density can result in higher optical loss, carrier injection, still other issues can arise. That is, if carrier injection (i.e., the process of introducing charge carriers from one region of a semiconductor to another as in the case of p-type of n-type semiconductors) is relied upon for wavelength tuning, cavity loss, and therefore, sacrifices in power, and accompanied device Joule-heating can result.

In most instances, it is preferable to tune the resonance of a modulator to match that of the ring laser to achieve the aforementioned equality in wavelength of the light propagating through the ring laser and ring modulator. However, if the resonant wavelengths of the ring laser and ring modulator are too disparate, it may be necessary to tune the lasing wavelength at the ring laser in addition to timing the ring modulator (especially when trying to reach a certain channel spacing target). Tuning a ring laser may require tuning the injection current, and/or external thermal tuning (as described above), each of which can create still other issues. External thermal tuning can be power hungry, resulting in laser gain degradation, and shifting lasing wavelengths. Injection current tuning can result in output power that either too high or too low, either of which can be undesirable, as well as changing the refractive indices of the aforementioned materials. Further still, it is often very difficult to bias multiple lasers at the same current, thereby complicating the detector side of an optical interconnection system.

Again, and as described above, the optical coupling of the ring laser 202 and the ring modulator 220 in accordance with various examples, allows for the resonant wavelengths of the ring laser 202 and the ring modulator 220 to be the same. Moreover, and even if wavelength tuning may be required, tuning of the ring modulator 220 effective refractive index would be sufficient, such that the ring laser 202 can remain constant.

Figure 4:
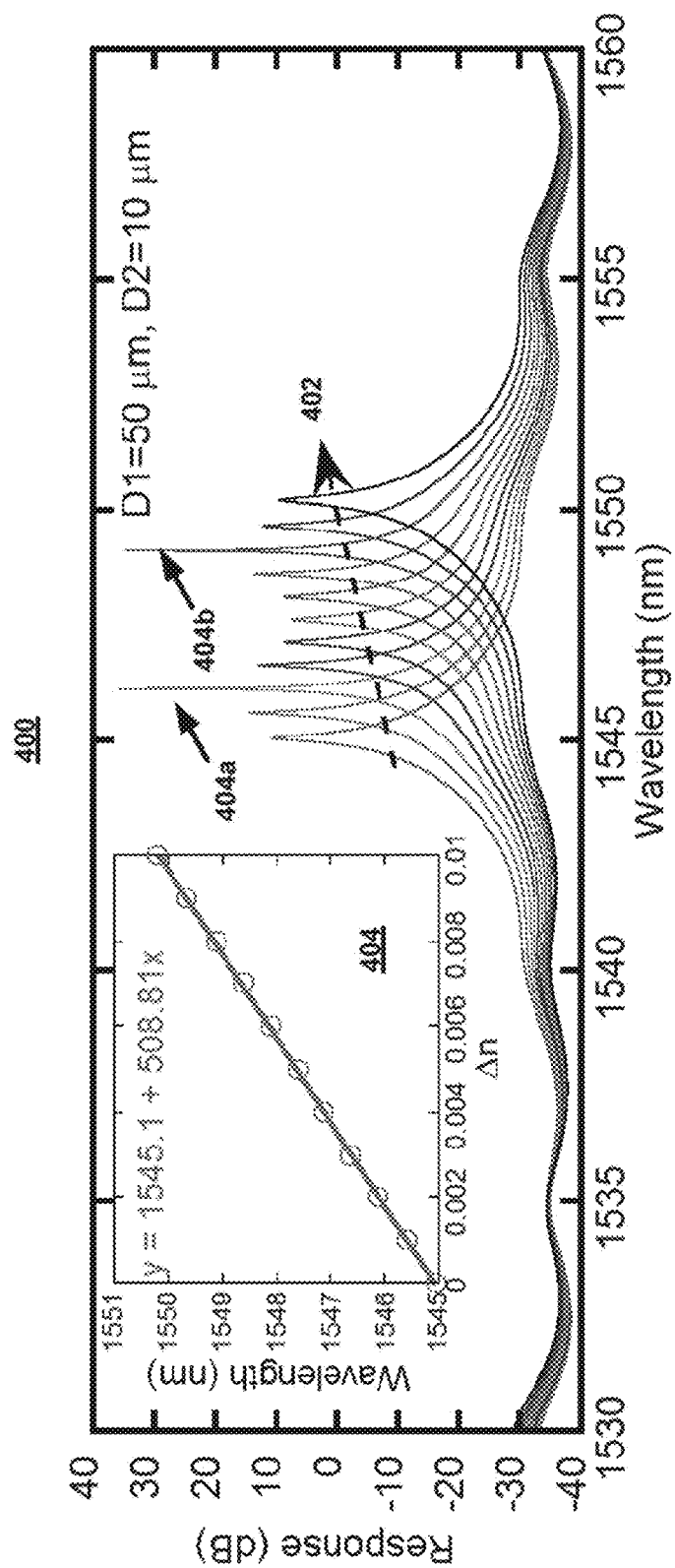
FIG. 4 illustrates example effects to wavelength tuning by adjusting the modulator effective refractive index of the coupled ring resonator system of FIG. 2A.

FIG. 4 illustrates an example graph 400 indicative of wavelength timing by adjusting the modal index of the ring modulator 220. That is, and adjusting the modal index of the ring modulator 220 by the amount of, e.g., 0-0.01, as illustrated by arrow 402, it can be seen that the shift in resonant wavelength is minimal (and linear with respect to wavelength) as seen in the inset graph 404). Therefore, the coupled ring resonator system 200 performs well with regard to tuning efficiency, where tuning and modulation efficiency and power consumption may be considered to be the same or on par with that of an individual modulator utilized in a conventional laser injection modulation system.

Coupled ring resonator systems are provided in accordance with various examples, where at least one ring laser and at least one ring modulator can be coupled together. The coupled ring laser and ring modulator can in turn, be coupled to a bus waveguide. The coupling of the ring laser and the ring modulator allow a laser resonator cavity to be formed where gain can be provided in either one of the ring laser or the ring modulator, and tailoring the coupled ring resonator system to different scenarios may be accomplished simply by adjusting the relative diameters of the ring laser and ring modulator. Therefore, FSR can be extended leading to single wavelength lasing even when using a large/larger ring laser cavity. Additionally, wavelength mismatch between the ring laser and ring modulator can be eliminated since they are coupled together to form a single cavity.

Moreover, the coupling as described in accordance with various examples can negate or at least minimize resonance mismatch issues as the resonant wavelength of the ring laser becomes that of the ring modulator and vice versa. Even if wave length timing is required, tuning can be performed at the ring modulator, negating a need for wavelength tuning at the ring laser. Such features allow various issues associated with conventional optical interconnect systems to be avoided or at the least, mitigated. For example, high-speed low-power consumption phase modulation can be accomplished by modulating the effective refractive/modal index of the ring modulator while holding the ring laser constant. Furthermore, continuous wavelength tuning by changing phase (e.g., via thermal or plasma dispersion methods) can be effectuated in the ring modulator without changing ring laser injection current.

Further still, and if the coupled ring resonator system is used as a continuous wave laser source (i.e., without modulation), the lasing wavelength can be locked while adjusting output power because the wavelength shift due to laser injection current change can be compensated by the shift due to carrier injection/depletion to the ring modulator. Also, wavelength locking can be a zero-power consumption procedure by using the MOS ring modulator 220 without direct current (DC) power consumption.

In certain applications, "direct modulation" of the ring laser may be desired without the use of the ring modulator by changing the ring laser biasing current. However, the wavelength of the light propagating within the ring laser may change by shifting up and down (i.e., chirp). Therefore, and in accordance with various examples, counter-playing/"balancing" the wavelength shift in the ring laser and ring modulator can be performed to counteract chirp, such that little to no chirp occurs during intensity modulation.

Additionally still, thermal tuning of the ring modulator need not degrade laser gain, and overall power consumption due to tuning can be much less than tuning power consumption of the ring laser. Overall electrical power consumption, including power to laser for certain optical output, modulator power, tuning power, may also be less in the coupled ring resonator system than in a conventional external modulation format system.

The foregoing description of various examples has been presented for purposes of illustration and description. The foregoing description is not intended to be exhaustive or limiting to the precise form disclosed, and modifications and variations are possible in light of the above teachings or may be acquired from practice of various examples. The examples discussed herein were chosen and described in order to explain the principles and the nature of various examples and its practical application to enable one skilled in the art to utilize rise various examples and with various modifications as are suited to the particular rise contemplated. The features of the examples described herein may be combined in all possible combinations of methods, apparatus, modules, systems, and computer program products.

What is claimed is:

1. A system, comprising:
a ring resonator element for imparting optical gain to a light signal, wherein the ring resonator element comprises a semiconductor gain material;
a ring modulator element directly evanescently optically coupled to the ring resonator element for modulating the light signal; and
a waveguide optically coupled to one of the ring resonator element and the ring modulator element,
wherein the waveguide receives the light signal output from the one of the ring resonator element and the ring modulator element, and
wherein the waveguide transmits the received light signal.

2. The system of claim 1, wherein the free spectral range (FSR) associated with the ring resonator element is configured to be sufficiently large based on relative diameters of the ring resonator element and the ring modulator element, such that the ring resonator lases at a single wavelength.

3. The system of claim 1, wherein the optical coupling of the ring resonator element and the ring modulator element form a single optical cavity in which the light signal circulates, and wherein the resonant wavelength of the ring resonator element matches the resonant wavelength of the ring modulator element.

4. The system of claim 1, wherein adjusting the phase of the ring modulator element tunes the resonant wavelength of the system without altering injection current of the ring resonator element.

5. The system of claim 1, wherein the lasing wavelength of the system remains locked during output power adjustment via injection current change to the ring resonator element by wavelength shift compensation via carrier injection to the ring modulator element.

6. The system of claim 1, wherein the optical gain remains constant during thermal tuning of the ring modulator element.

7. The system of claim 1, wherein tuning the ring modulator element consumes less power than tuning the ring resonator element.

8. The system of claim 1, wherein balancing wavelength shift at the ring resonator element and at the ring modulator element counteracts chirp while adjusting biasing current of the ring resonator element.

9. The system of claim 1 wherein the ring resonator element lases at a plurality of wavelengths absent the ring modulator element, and wherein the combined ring resonator element and ring modulator element lases at substantially a single wavelength.

10. The system of claim 9, wherein the combined ring resonator element and ring modulator element lases at substantially the single wavelength due, in part, to a diameter of the ring resonator element relative to a diameter of the ring modulator element.

11. The system of claim 10, wherein the diameter of the ring resonator element is different from the diameter of the ring modulator element.

12. The system of claim 1, wherein the ring modulator element is evanescently coupled to the waveguide.

13. The system of claim 1, wherein the ring resonator element, the ring modulator element, and the waveguide are each deposited on a shared semiconductor layer.

14. The system of claim 1, wherein the ring resonator element comprises a contact layer, a cladding layer, and an optically active layer.

15. An apparatus, comprising:
a ring laser for imparting optical gain to a light signal; and
a ring modulator directly evanescently optically coupled to the ring laser,
wherein the ring laser lases at a plurality of wavelengths absent the ring modulator, and
wherein the ring modulator is configured such that the combined ring laser and ring modulator outputs the light signal at substantially a single wavelength; and
a bus waveguide optically coupled to the ring modulator for receiving the light signal output from the ring modulator and transmitting the light signal.

16. The apparatus of claim 15, wherein the combined ring laser and the ring modulator outputs the light signal at substantially the single wavelength based on the ring laser having a larger diameter relative to the ring modulator to cause a Vernier effect.

17. The apparatus of claim 15, wherein the ring laser and the ring modulator form a single optical cavity in which the light signal circulates prior to being output to the bus waveguide.

18. The apparatus of claim 15, wherein tuning the ring modulator consumes less power than tuning the ring laser, and wherein temperature changes resulting on the ring modulator during tuning have substantially minimal effect on the ring laser.

19. An apparatus, comprising:
a single optical cavity formed by at least one ring laser directly evanescently optically coupled to at least one ring modulator, wherein the at least one ring laser lases at a single wavelength, and wherein each ring laser of the at least one ring laser imparts optical gain to a light signal; and
a bus waveguide optically coupled to one of the at least one ring modulator and the at least one ring laser for transmitting the light signal at the single wavelength.

20. The apparatus of claim 19, wherein the at least one ring laser comprises a hybrid silicon microring laser.

21. The apparatus of claim 19, wherein the at least one ring modulator comprises a hybrid silicon metal-oxide-semiconductor (MOS) ring modulator.

* * * * *